(12) United States Patent
Cho et al.

(10) Patent No.: US 8,516,412 B2
(45) Date of Patent: Aug. 20, 2013

(54) SOFT HIERARCHY-BASED PHYSICAL SYNTHESIS FOR LARGE-SCALE, HIGH-PERFORMANCE CIRCUITS

(75) Inventors: Minsik Cho, Austin, TX (US); Alvan W. Ng, Austin, TX (US); Ruchir Puri, Baldwin Place, NY (US); Haoxing Ren, Austin, TX (US); Hua Xiang, Ossining, NY (US); Matthew M. Ziegler, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 13/222,928

(22) Filed: Aug. 31, 2011

(65) Prior Publication Data

US 2013/0055176 A1   Feb. 28, 2013

(51) Int. Cl.
*G06F 17/50* (2006.01)

(52) U.S. Cl.
USPC ........... 716/103; 716/100; 716/101; 716/104; 716/105; 716/118; 716/119

(58) Field of Classification Search
USPC ......... 716/100–101, 103–105, 110, 118–119, 716/122, 138
See application file for complete search history.

(56) References Cited

U.S. PATENT DOCUMENTS

| | | | | |
|---|---|---|---|---|
| 6,170,080 | B1 * | 1/2001 | Ginetti et al. | 716/104 |
| 6,223,329 | B1 * | 4/2001 | Ling et al. | 716/129 |
| 6,298,468 | B1 * | 10/2001 | Zhen | 716/122 |
| 6,651,235 | B2 * | 11/2003 | Dai et al. | 716/55 |
| 6,754,878 | B1 * | 6/2004 | Stentz et al. | 716/101 |
| 7,178,120 | B2 | 2/2007 | Hieter et al. | |
| 7,269,815 | B2 * | 9/2007 | Wein et al. | 716/105 |
| 7,409,658 | B2 | 8/2008 | Shang | |
| 7,418,686 | B1 | 8/2008 | Knol et al. | |
| 7,716,614 | B2 * | 5/2010 | Kauth et al. | 716/118 |
| 7,937,678 | B2 * | 5/2011 | Lippmann et al. | 716/103 |
| 8,074,198 | B2 * | 12/2011 | Uchida | 716/126 |
| 8,122,399 | B2 * | 2/2012 | Bowers et al. | 716/104 |
| 8,136,062 | B2 * | 3/2012 | Steinmetz et al. | 716/104 |
| 8,156,458 | B2 * | 4/2012 | Baker et al. | 716/107 |
| 2004/0044979 | A1 | 3/2004 | Aji et al. | |
| 2004/0078767 | A1 | 4/2004 | Burks et al. | |
| 2005/0204315 | A1 * | 9/2005 | Knol et al. | 716/2 |
| 2006/0101358 | A1 * | 5/2006 | Shah et al. | 716/4 |
| 2007/0245280 | A1 * | 10/2007 | Van Eijk et al. | 716/9 |
| 2008/0216032 | A1 | 9/2008 | McElvain et al. | |
| 2008/0244493 | A1 | 10/2008 | Finkler | |

(Continued)

OTHER PUBLICATIONS

Zhan, Yong, et al., "A Fied-die Floorplanning Algorithm Using an Analytical Approach". Jan. 2006. IEEE, Design Automation Asia and South Pacific Conference. pp. 1-6.*

(Continued)

*Primary Examiner* — Stacy Whitmore
(74) *Attorney, Agent, or Firm* — Preston J. Young

(57) ABSTRACT

In one embodiment, the invention is a method and apparatus for soft hierarchy-based synthesis for large-scale, high-performance circuits. One embodiment of a method for physically synthesizing a design of an integrated circuit includes compiling a logical description of the design into a flattened netlist, extracting a soft hierarchy from the flattened netlist, wherein the soft hierarchy defines a boundary on a die across which cells of the integrated circuit are permitted to move, and placing a cell of the integrated circuit on the die in accordance with the soft hierarchy.

23 Claims, 7 Drawing Sheets

(56) References Cited

U.S. PATENT DOCUMENTS

| | | | |
|---|---|---|---|
| 2009/0031278 A1* | 1/2009 | McElvain et al. | 716/18 |
| 2010/0058269 A1* | 3/2010 | Baker et al. | 716/10 |
| 2010/0058272 A1* | 3/2010 | Bowers et al. | 716/12 |
| 2010/0058275 A1* | 3/2010 | Polomik et al. | 716/17 |
| 2010/0235799 A1* | 9/2010 | Rice et al. | 716/8 |
| 2011/0093827 A1* | 4/2011 | Tsurusaki et al. | 716/113 |
| 2012/0005643 A1* | 1/2012 | Schroeder et al. | 716/119 |
| 2012/0054699 A1* | 3/2012 | Cho et al. | 716/102 |

OTHER PUBLICATIONS

Rutenbar, R. A. at al. (Mar. 2007). Hierarchical Modeling, Optimization, and Synthesis for System-Level Analog and RF Designs. Proceedings of the IEEE, 95(3), pp. 640-669.

Disclosed Anonymously (Sep. 2007). A pseudo hierarchy approach for improved performance and reduced logic overhead in very high speed processors. IP.com No. IPCOM000199907D, pp. 1-6.

Chaomin Luo, et al., "Large-scale fixed-outline floorplanning design using convex optimization techniques" (2008) in $13^{th}$ Asia and South Pacific Design Automation Conference, 6 pages.

Jai-Ming Lin, et al., "UFO: Unified Convex Optimization Algorithms for Fixed-Outline Floorplanning," in Proc. of ACM Asia South Pacific Design Automation Conference (ASP-DAC), Taipei, Taiwan, pp. 555-560, Jan. 2010.

Michael D. Moffit, et al., "Constraint-driven floorplan repair," Jul. 2006, DAC '06: Proceedings of the $43^{rd}$ Annual Design Automation Conference, Publisher: ACM, 6 pages.

* cited by examiner

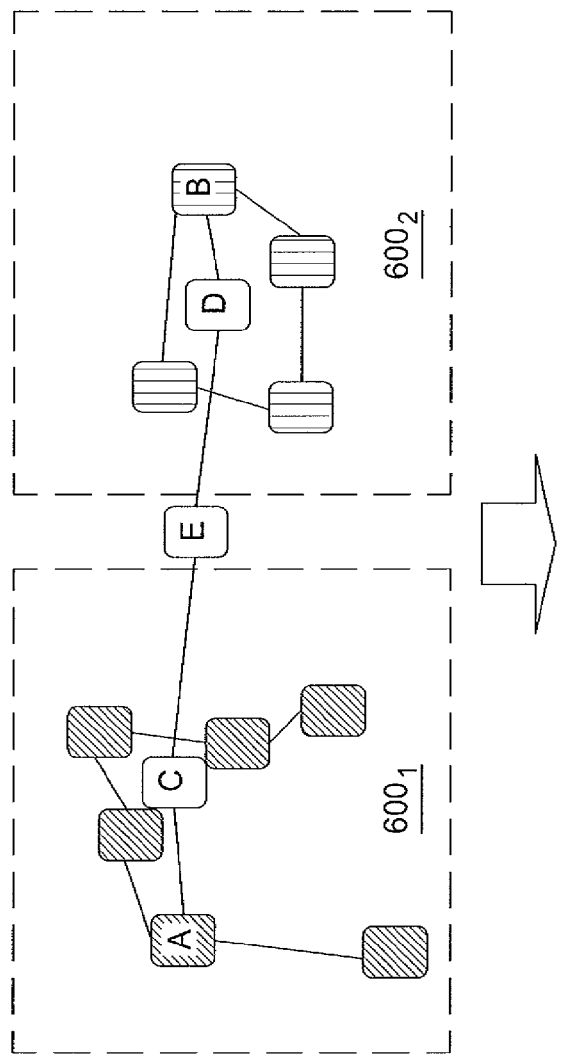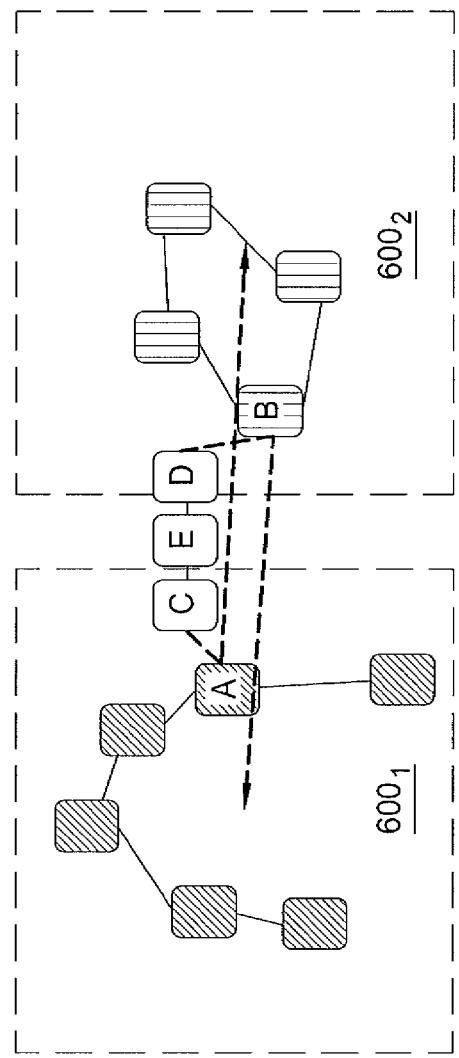
FIG. 6A
FIG. 6B ly the logic description at one time. This provides for global optimization and often results in a good layout. However, flat synthesis does not allow for floorplanning, and thus offers little user control. Thus, flat synthesis may not be the best approach for large-scale designs, in which a single objective flat placement and optimization may not be optimal. For example, control logic regions of the design may require more empty space than datapath regions, or critical regions may need to be placed in certain areas of the circuit. Although movebound constraints may be used to guide accommodate these requirements, the parameters for the movebound constraints are generally difficult to generate.

SOFT HIERARCHY-BASED PHYSICAL SYNTHESIS FOR LARGE-SCALE, HIGH-PERFORMANCE CIRCUITS

BACKGROUND OF THE INVENTION

The present invention relates generally to design automation, and relates more particularly to the physical synthesis of large-scale, high-performance circuits.

Physical synthesis converts a logical description of an integrated circuit (IC) design into a physical layout. Two particular physical synthesis techniques are conventionally used to convert descriptions of large-scale ICs: a flat synthesis approach and a hierarchical approach.

The flat synthesis approach synthesizes all gates in the logical description at one time. This provides for global optimization and often results in a good layout. However, flat synthesis does not allow for floorplanning, and thus offers little user control. Thus, flat synthesis may not be the best approach for large-scale designs, in which a single objective flat placement and optimization may not be optimal. For example, control logic regions of the design may require more empty space than datapath regions, or critical regions may need to be placed in certain areas of the circuit. Although movebound constraints may be used to guide accommodate these requirements, the parameters for the movebound constraints are generally difficult to generate.

The hierarchical approach separates the gates in the logical description into multiple partitions, and then synthesizes each partition individually. Although the hierarchical approach offers greater user control over the critical path and critical regions of the circuit, the boundary logic is not optimized because partition boundaries prevent cross-boundary optimization. In addition, the quality of the synthesis relies heavily on the locations and timing assertions that are used to assign the boundary pins that define the boundaries of each partition. The locations in particular are difficult to assign optimally.

SUMMARY OF THE INVENTION

In one embodiment, the invention is a method and apparatus for soft hierarchy-based synthesis for large-scale, high-performance circuits. One embodiment of a method for physically synthesizing a design of an integrated circuit includes compiling a logical description of the design into a flattened netlist, extracting a soft hierarchy from the flattened netlist, wherein the soft hierarchy defines a boundary on a die across which cells of the integrated circuit are permitted to move, and placing a cell of the integrated circuit on the die in accordance with the soft hierarchy.

BRIEF DESCRIPTION OF THE DRAWINGS

So that the manner in which the above recited features of the present invention can be understood in detail, a more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 5A-5E are schematic diagrams illustrating various floorplanning steps of FIG. 4 in greater detail;

FIGS. 6A-6B are schematic diagrams illustrating two exemplary movebounds having a plurality of cells assigned therein.

DETAILED DESCRIPTION

In one embodiment, the present invention is a method and apparatus for soft hierarchy-based physical synthesis for large-scale, high-performance circuits. Embodiments of the invention perform physical synthesis by combining a substantially flat approach with soft boundaries. In particular, optimization and placement are conducted on a flat netlist. However, placement is constrained by soft boundaries that are created based on logic modules within the design. Within the context of the present invention, a "soft" boundary refers to a boundary across which gates may be moved, if necessary. For example, during timing analysis, optimization transforms may move gates from within the boundary to outside the boundary.

Figure 1:
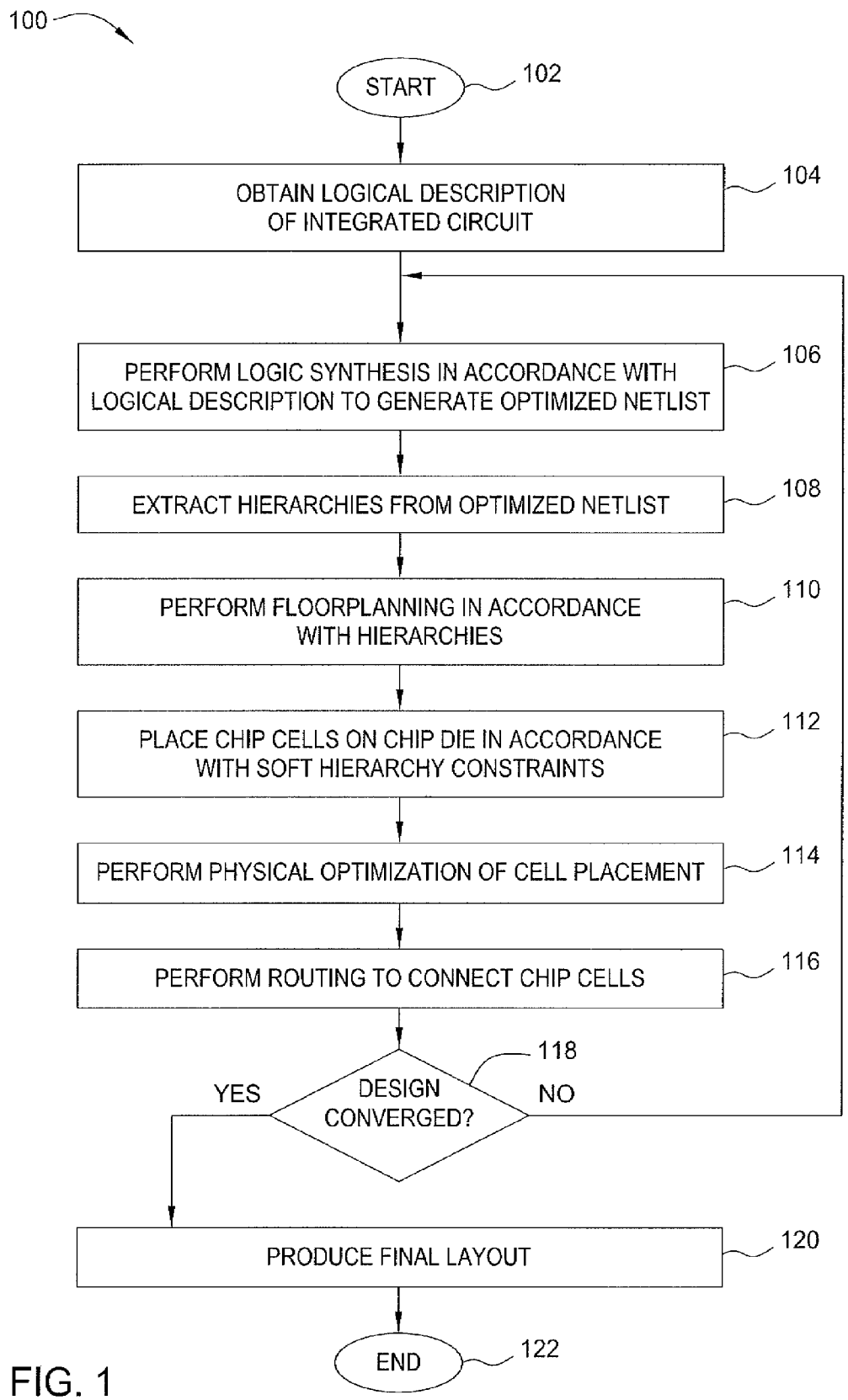
FIG. 1 is a flow diagram illustrating one embodiment of a method for performing physical synthesis of an integrated circuit, according to the present invention.

FIG. 1 is a flow diagram illustrating one embodiment of a method 100 for performing physical synthesis of an integrated circuit, according to the present invention. The method 100 may be implemented, for example, to synthesize a large-scale, high-performance circuit.

The method 100 is initialized at step 102 and proceeds to step 104, where logical description of the integrated circuit is obtained. In one embodiment, the logical description is embodied in a register transfer level (RTL) language.

In step 106, logic (front-end) synthesis is performed in accordance with the logical description. Logic synthesis involves compiling the logical description and generating an optimized (gate-level) netlist based on wire load models. During logic synthesis in accordance with step 106, hierarchical designs in the netlist are flattened.

In step 108, a hierarchy is extracted from the optimized netlist. As discussed above, this extraction is performed on a flattened netlist; however, because the netlist is flattened, hierarchical information may not be maintained for each item in the netlist. For example, a buffer may be inserted between two gates during optimization, in order to correct a timing issue. Although the two gates may carry the hierarchical information (e.g., by keeping hierarchical gate names or prefixes that identify the logic module to which they belong in the netlist), the inserted buffer may not include the hierarchical information. One particular embodiment of a method for performing extraction in accordance with step 108 is described in further detail in conjunction with FIGS. 2 and 3.

In step 110, floorplanning is performed. Floorplanning involves placing logic modules (i.e., groups of gates) in different locations on the chip die in a manner that optimizes various objectives (e.g., wire length, timing, power, temperature, and the like). In one embodiment, floorplanning in accordance with step 110 includes identifying soft boundaries. As discussed above, a soft boundary is a boundary across which a gate may be moved, if necessary. One particular embodiment of a method for floorplanning in accordance with step 110 is described in further detail in conjunction with FIGS. 4 and 5.

In step 112, placement of the IC chip cells (gates) on the chip die is performed. In one embodiment, placement in accordance with step 112 includes identifying and honoring any constraints for the soft hierarchy. These constraints may include, for example, movebound constraints and attractions, as discussed in further detail below.

In step 114, physical optimization is performed. This step transforms the netlist and the layout to account for wiring delays based on estimated and/or real routing.

In step 116, routing is performed. Routing in accordance with step 116 involves creating wires that connect the cells on the chip die.

In step 118, it is determined whether the design has converged. Physical synthesis of IC designs often requires multiple placement and optimization steps before the design converges. Thus, if it is concluded in step 118 that the design has not converged, the method 100 returns to step 106. The method 100 then proceeds as described above, repeating steps 106-116 as necessary until the design converges.

Alternatively, if it is concluded in step 118 that the design has converged, then a final layout is produced as output in step 120. The method 100 then terminates in step 122.

The extraction and floorplanning steps (i.e., steps 108-110) can be performed prior to any placement step (e.g., step 112) in the method 100.

Hierarchical logic modules (i.e., groups of gates) can be created automatically or with user guidance. For instance, in the absence of any special requirements, the logic modules can be generated automatically based on hierarchical levels. Alternatively, a designer can specify, via a user interface, a full or partial logic module list. In one embodiment, such a user interface provides a flexible way to specify logic modules (e.g., by merging logic modules from different hierarchical levels when the sub-modules have strong connectivity).

Figure 2:
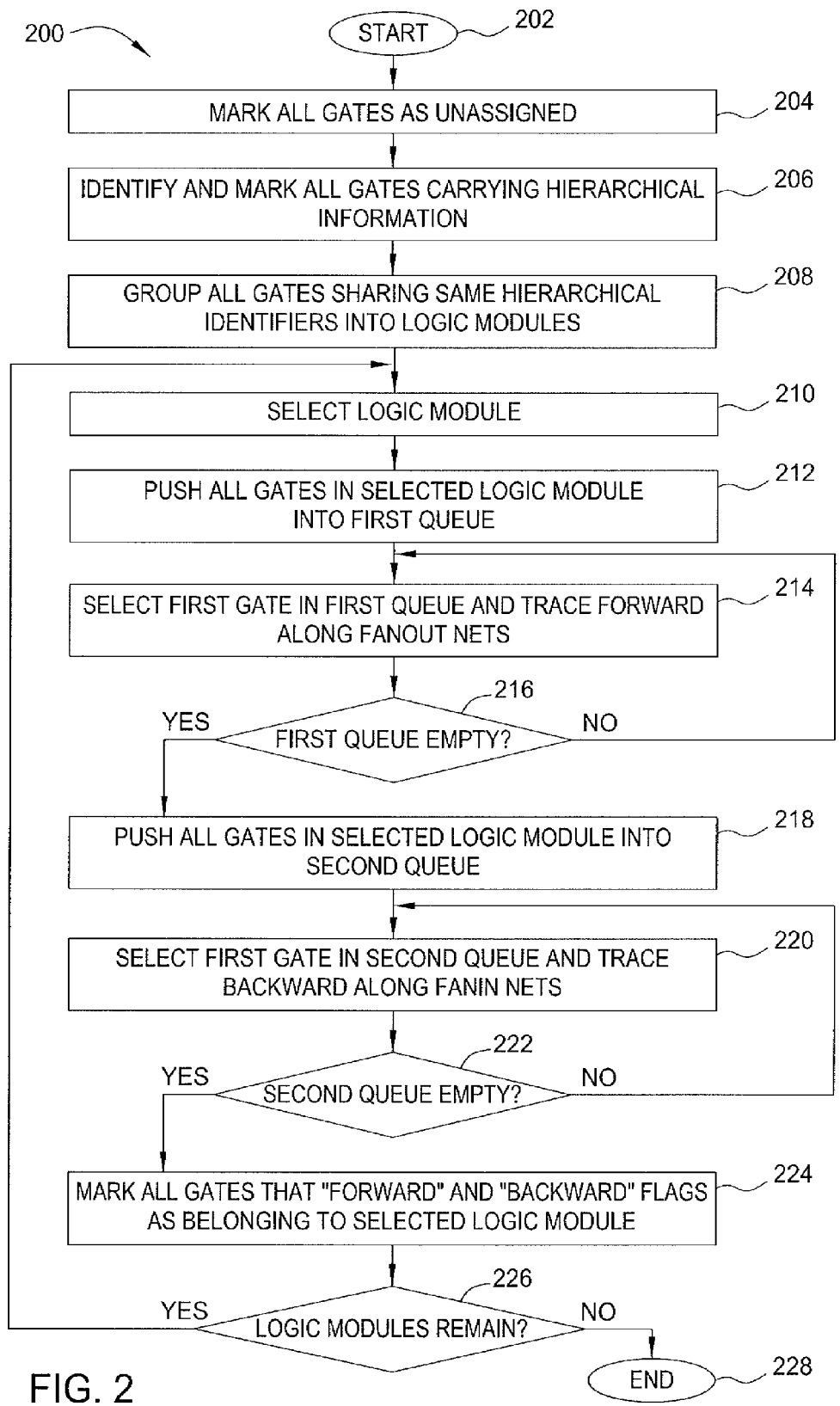
FIG. 2 is a flow diagram illustrating one embodiment of a method 20 for extracting hierarchies from flattened netlists, according to the present invention.

FIG. 2 is a flow diagram illustrating one embodiment of a method 200 for extracting hierarchies from flattened netlists, according to the present invention. As discussed above, the method 200 may be implemented in accordance with step 108 of the method 100.

The method 200 is initialized in step 202 and proceeds to step 204, where all gates in the flattened netlist are marked as unassigned.

In step 206, all gates that carry hierarchical information are identified and marked with the identifier of the logic module corresponding to the hierarchical information.

In step 208, all gates sharing the same hierarchical information are grouped into logic modules. Thus, the gates that have retained hierarchical information will form the basic gate set of each logic module.

In step 210, a logic module is selected for analysis. Then, in step 212, all gates in the selected logic module are pushed into a first queue.

In step 214, the first gate in the first queue is selected, and the method 200 traces forward along the gate's fanout nets. Tracing forward along a gate's fanout nets includes pushing the sink gate into the first queue and marking the selected gate with a "forward" flag.

In step 216, it is determined whether the first queue is empty. If it is concluded in step 216 that the first queue is not empty, the method 200 returns to step 214 and traces along the fanout nets of the (new) first gate in the first queue.

Alternatively, if it is concluded in step 216 that the first queue is empty, then the method 200 proceeds to step 218. In step 218, all of the gates in the selected logic module are pushed into a second queue.

In step 220, the first gate in the second queue is selected, and the method 200 traces backward along the gate's fanin nets. Tracing backward along a gate's fanin nets includes pushing the source gate into the second queue and marking the selected gate with a "backward" flag.

In step 222, it is determined whether the second queue is empty. If it is concluded in step 222 that the second queue is not empty, the method 200 returns to step 220 and traces along the fanin nets of the (new) first gate in the second queue.

Alternatively, if it is concluded in step 222 that the second queue is empty, then the method 200 proceeds to step 224. In step 224, all gates that have been marked with both "forward" and "backward" flags are marked as gates of the selected logic module.

In step 226, it is determined whether any logic modules remain for analysis. If it is concluded in step 226 that there are remaining logic modules, then the method 200 returns to step 210 and selects a next logic module for analysis. The method 200 then proceeds as describe above, repeating steps 210-224 as necessary until all logic modules have been analyzed.

Alternatively, if it is concluded in step 226 that there are no remaining logic modules, then method 200 terminates in step 228.

Thus, the method 200 can correctly assign gates to their corresponding logic modules. However, in some instances, gates may exist in between or may connect logic modules; such gates are sometimes referred to as "dust logic." Dust logic may also need to be assigned to logic modules in order to facilitate floorplanning.

Figure 3:
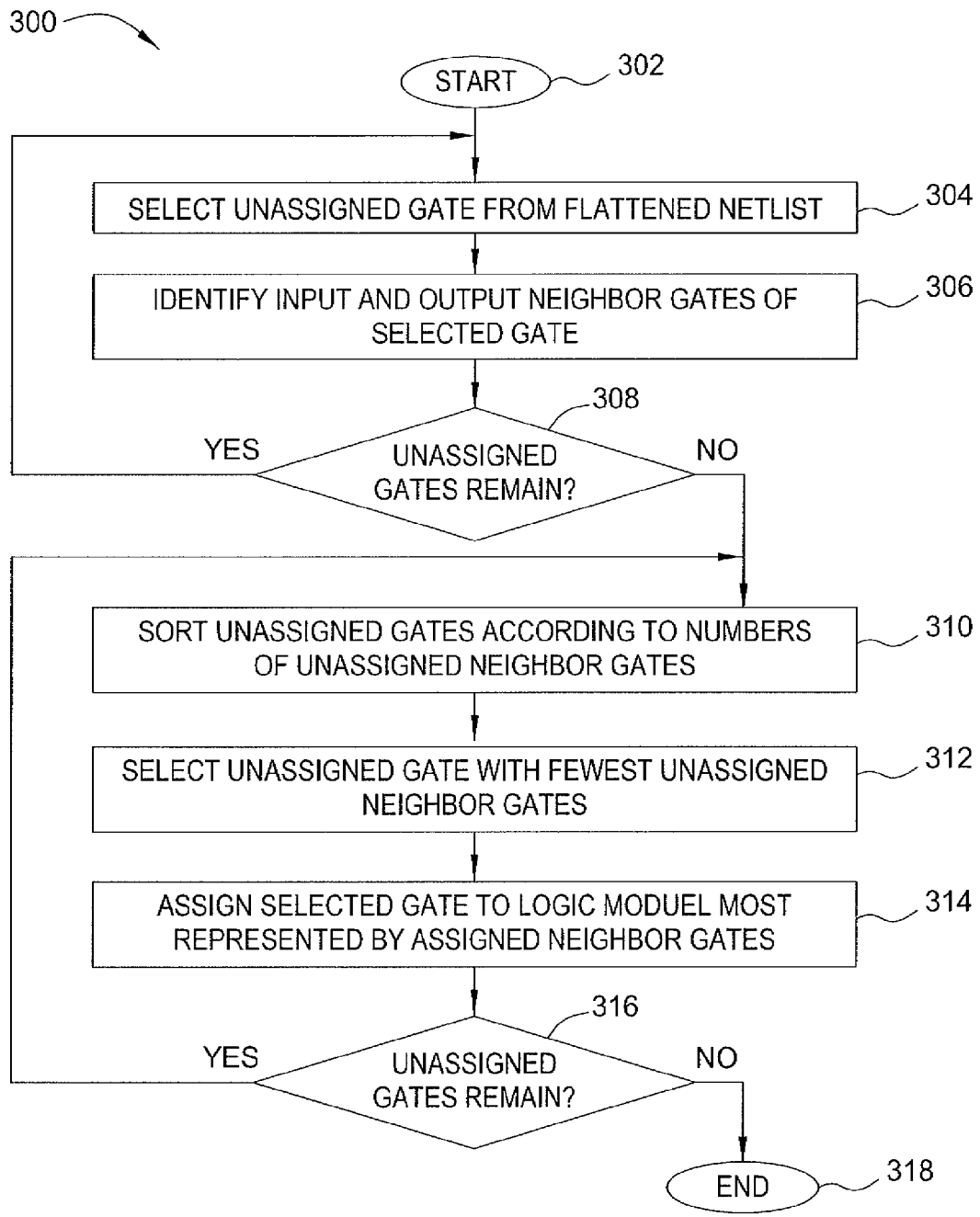
FIG. 3 is a flow diagram illustrating one embodiment of a method for assigning dust logic to logic modules during hierarchy extraction, according to the present invention.

FIG. 3 is a flow diagram illustrating one embodiment of a method 300 for assigning dust logic to logic modules during hierarchy extraction, according to the present invention. As discussed above, the method 300, like the method 200, may be implemented in accordance with step 108 of the method 100. In one embodiment, the method 300 is implemented after implementation of the method 200 (i.e., dust logic is assigned after logic module internal gates are identified).

The method 300 is initialized in step 302 and proceeds to step 304, where an unassigned gate is selected from the flattened netlist.

In step 306, the input and output neighbor gates of the selected gate are identified. Then, in step 308, it is determined whether any unassigned gates remain. If it is concluded in step 308 that unassigned gates do remain, then the method 300 returns to step 304 and selects a new unassigned gate. Steps 306-308 are then repeated until no unassigned gates remain.

Alternatively, if it is concluded in step 308 that no unassigned gates remain, then the method 300 proceeds to step 310. In step 310, all of the unassigned gates are sorted according to their respective numbers of unassigned neighbor gates.

In step 312, the unassigned gate with the fewest unassigned neighbor gates is selected. In step 314, this selected gate is assigned to the logic module that is most represented by the selected gate's assigned neighbors (i.e., whichever logic module contains the greatest number of the selected gates' neighbor gates).

In step 316, it is determined whether any gates remain to be assigned. If it is concluded in step 316 that gates still remain to be assigned, then the method 300 returns to step 310, and the unassigned gates are re-sorted. Steps 312-314 are then repeated until no gates remain to be assigned.

Alternatively, if it is concluded in step 316 that no gates remain to be assigned, then the method 300 terminates in step 318.

It is possible that several iterations of the method 300 may be necessary in order to assign a particular gate. For example, an inverter has only one input and one output. Thus, even if both the input gate and the output gate are unassigned, the number of unassigned neighbor gates is relatively small (i.e., two). As such, the inverter might be the first unassigned gate to be selected after sorting, and yet still remain unassigned since none of its neighbors are assigned to any logic modules. However, after a few iterations of the method 300, the neighbor gates may get assigned, and, at this point, the inverter can be assigned as well.

Figure 4:
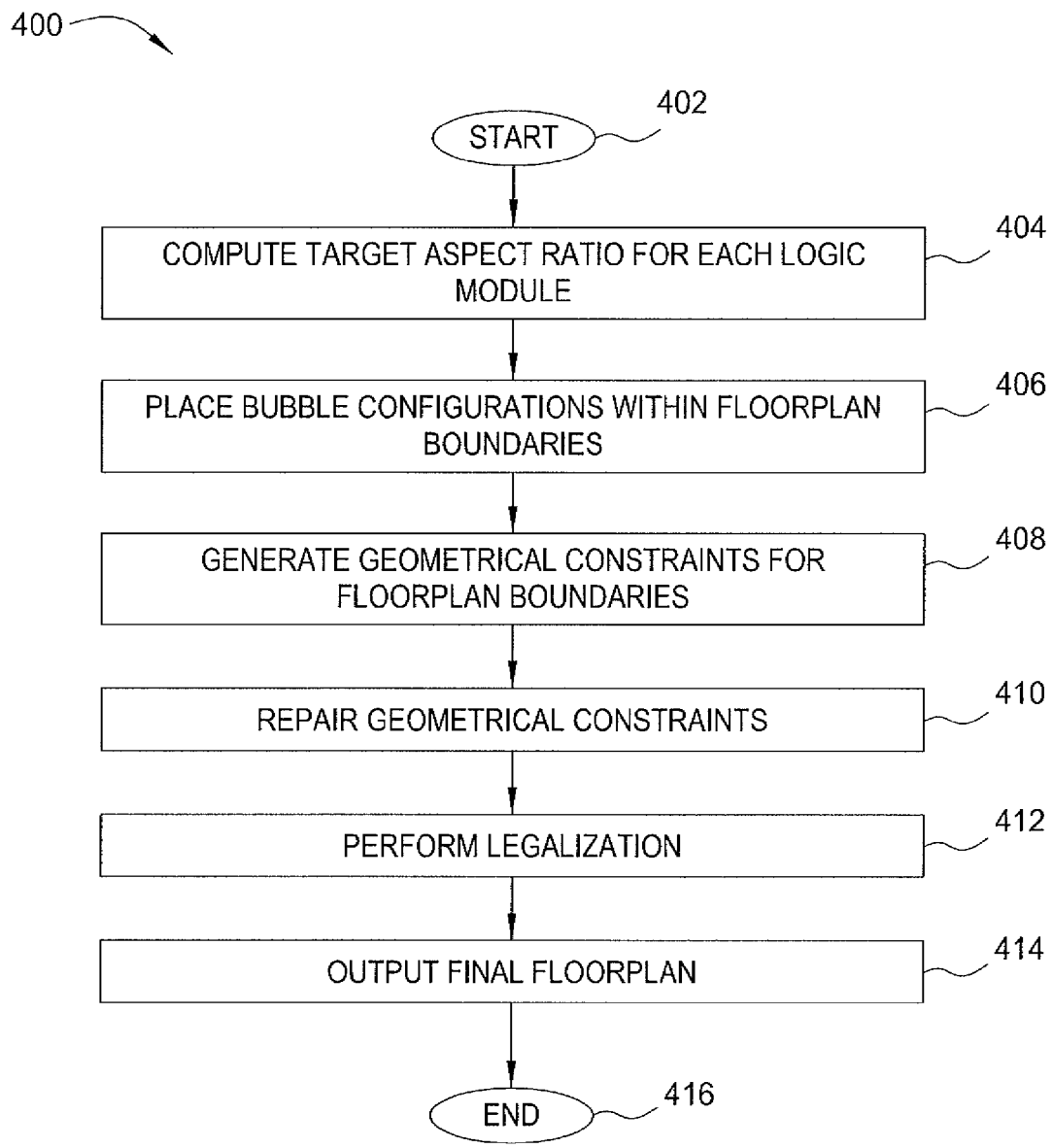
FIG. 4 is a flow diagram illustrating one embodiment of a method for performing floorplanning, according to the present invention.

FIG. 4 is a flow diagram illustrating one embodiment of a method 400 for performing floorplanning, according to the present invention. The method 400 relies in part on the placement of "bubbles" or circular objects that can represent logic modules with arbitrary shapes. As discussed above, the method 400 may be implemented in accordance with step 110 of the method 100.

FIGS. 5A-5E are schematic diagrams illustrating various floorplanning steps of FIG. 4 in greater detail. As such, FIGS. 4 and 5A-5E may be referred to simultaneously in order to enhance understanding of floorplanning according to the present invention.

The method 400 is initialized in step 402 and proceeds to step 404, where the target aspect ratio of each logic module is computed. In one embodiment, the target aspect ratio of a logic module is computed as the square root of the minimum aspect ratio multiplied by the maximum aspect ratio. For hard logic modules (i.e., logic modules whose aspect ratios cannot be adjusted for better area utilization), the target aspect ratio, minimum aspect ratio, and maximum ratio are the same. The final step to computing the target aspect ratio of a logic module is to identify the best bubble configuration (containing less than N bubbles) for the logic module. For example, as illustrated in FIGS. 5A-5B, five exemplary logic modules $500_1$-$500_5$ (hereinafter collectively referred to as "logic modules 500") are converted to bubble configurations containing varying numbers of bubbles (e.g., one to six bubbles in the exemplary illustration).

Figure 5E:
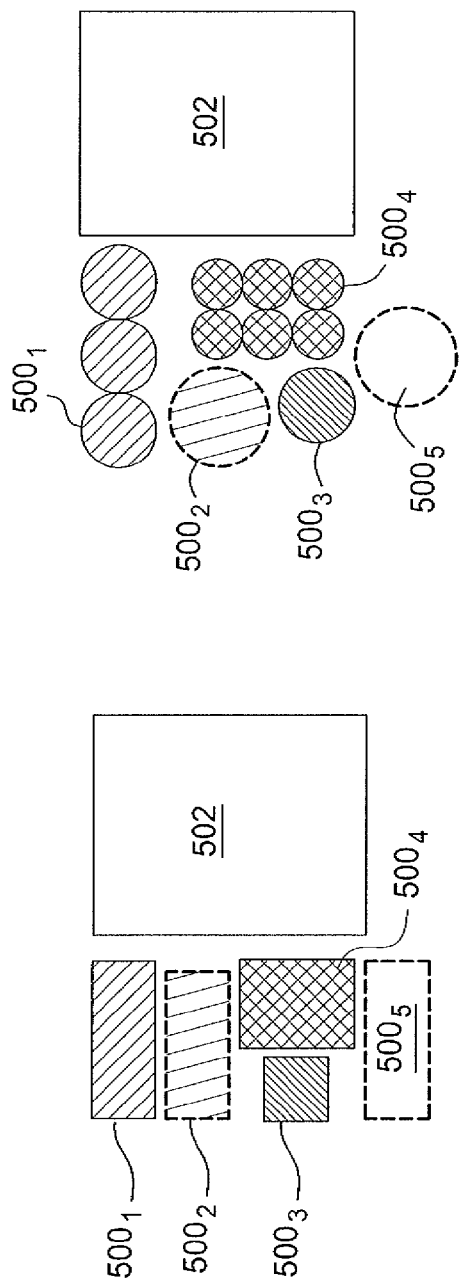
Figure 5E:
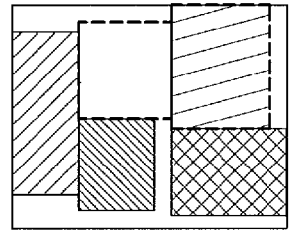
Figure 5D:
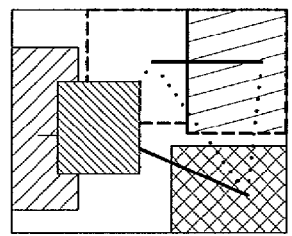
Figure 5C:
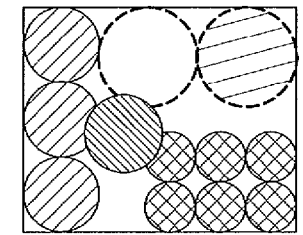

In step 406, the bubble configurations are placed within the boundaries of the floorplan 502. Placement in accordance with step 406 involves keeping each bubble configuration intact. For instance, a bubble configuration comprising three bubbles cannot be separated into 2 or three groups of bubbles. Moreover, the bubble configurations are placed in a manner that avoids or minimizes overlap. FIG. 5C, for example, illustrates an exemplary placement of the bubble configurations illustrated in FIG. 5B. In one embodiment, placement in accordance with step 406 optimizes an objective function (i.e., a linear summation of the total weighted wire length and total overlapped area).

In step 408, geometrical constraints for the floorplan boundaries are generated. This step involves capturing the relative horizontal and vertical order between the centers of bubbles of a single logic module. FIG. 5D, for instance, illustrates the generation of such constraints for the exemplary placement illustrated in FIG. 5C. As illustrated, the bubble configurations are now converted to substantially quadrilateral representations.

In step 410, the geometrical constraints are repaired. In one embodiment, this step involves building horizontal and vertical constraint graphs from the horizontal and vertical orders, and then computing the longest length for the horizontal and vertical graphs with the best possible aspect ratio.

In step 412, legalization is performed. In one embodiment, the legalization is convex optimization-based legalization. If legalization cannot be achieved (i.e., the logic modules cannot be fit within the floorplan boundaries without overlap), then constraint repairing (i.e., in accordance with step 410) and legalization may be repeated with a scaled down fixed-outline of the floorplan boundaries.

In step 414, the final floorplan is output for use. The method 400 then terminates in step 416.

As discussed above (e.g., in accordance with step 112 of the method 100) placement of IC chip cells (gates) on the chip die includes identifying and honoring any constraints (e.g., movebound constraints and attractions) for the soft hierarchy. Movebound constraints typically require that certain cells be placed within a certain rectangular area ("movebound") of the chip die. An "inclusive" movebound allows cells other than those specified by the design to be placed within the movebound; an "exclusive" movebound does not allow this. Attractions are additional forces enforced between two cells or between a cell and a fixed point. An attraction will pull the two cells together, or pull the cell closer to the fixed point.

For a soft hierarchy, attractions can be created between a cell and the four corners of the floorplanned rectangular area to which the cell belongs, such that the cell is pulled into the rectangular region. However, if strong forces (such as those generated by a timing critical path) pull the cell outside of the rectangular area, the cell may still be placed outside the rectangular area (for example if the cell is connected to a critical cell residing outside of the rectangular area); thus, attractions do not necessarily firmly constrain placement.

One embodiment of the invention improves the placement of gates on the boundary between two or more movebounds. FIGS. 6A-6B, for example, are schematic diagrams illustrating two exemplary movebounds having a plurality of cells assigned therein. Specifically, the first movebound $600_1$ has assigned to it a first plurality of cells (shaded by vertical lines), while the second movebound $600_2$ has assigned to it a second plurality of cells (shaded by horizontal lines). In addition, cells C, E, and D are not assigned to either movebound. However, unassigned cells C, E, and D connect cell A in the first movebound $600_1$ to cell B in the second movebound $600_2$. Hence, cells A and B are referred to as "boundary gates." With movebound constraints, it is possible that cells A and B would be placed relatively far away from each other, as illustrated in FIG. 6A.

However, boundary gates are ideally placed closed to the boundaries of their respective movebounds. To achieve this, attractions are created on the boundary gates to pull the boundary gates toward their designated directions. FIG. 6B, for instance, illustrates the result of creating a first attraction between cell A and the center of the second movebound $600_2$ and a second attraction between cell B and the center of the first movebound $600_1$. These attractions will help guides cells A and B to be placed closer to the boundaries of their respective movebounds, as illustrated. Furthermore, this results in the unassigned cells C, E, and D being placed on the boundaries, as illustrated.

Figure 7:
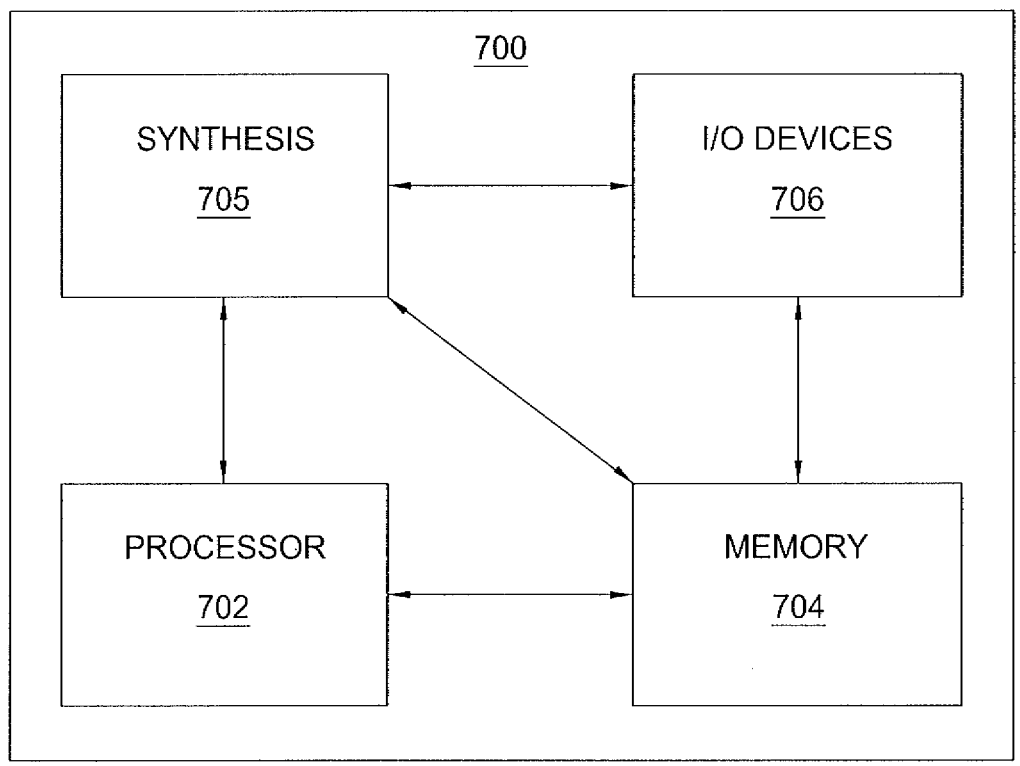
FIG. 7 is a high-level block diagram of physical synthesis method that is implemented using a general purpose computing device.

FIG. 7 is a high-level block diagram of physical synthesis method that is implemented using a general purpose computing device 700. In one embodiment, a general purpose computing device 700 comprises a processor 702, a memory 704, a synthesis module 705 and various input/output (I/O) devices 706 such as a display, a keyboard, a mouse, a stylus, a wireless network access card, and the like. In one embodiment, at least one I/O device is a storage device (e.g., a disk drive, an optical disk drive, a floppy disk drive, a path selection tool, and/or a test pattern generation tool). It should be understood that the synthesis module 705 can be implemented as a physical device or subsystem that is coupled to a processor through a communication channel.

Alternatively, the synthesis module 705 can be represented by one or more software applications (or even a combination of software and hardware, e.g., using Application Specific Integrated Circuits (ASIC)), where the software is loaded from a storage medium (e.g., I/O devices 606) and operated by the processor 702 in the memory 704 of the general purpose computing device 700. Thus, in one embodiment, the synthesis module 705 for performing soft hierarchy-based physical synthesis of large-scale, high-performance circuits as described herein with reference to the preceding Figures, can be stored on a computer readable storage device (e.g., RAM, magnetic or optical drive or diskette, and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. A method for physically synthesizing a design of an integrated circuit, the method comprising:
   compiling a logical description of the design into a flattened netlist;
   extracting a soft hierarchy from the flattened netlist, wherein the soft hierarchy defines a boundary on a die across which cells of the integrated circuit are permitted to move, wherein the extracting comprises:
      assigning gates in the flattened netlist to one or more logic modules, wherein the assigning comprises:
         marking those of the gates that carry hierarchical information with an identifier that indicates one of the one or more logic modules corresponding to the hierarchical information; and
         grouping those of the gates that are marked with a common identifier into a common one of the one or more logic modules; and
   placing a cell of the integrated circuit on the die in accordance with the soft hierarchy,
   wherein at least one of: the compiling, the extracting, or the placing is performed using a processor.

2. The method of claim 1, wherein the assigning further comprises, for a given one of the one or more logic modules:
   tracing forward along a fanout net of each gate in the given one of the one or more logic modules, while marking the each gate with a "forward" flag;
   tracing backward along a fanin net of the each gate, while marking the each gate with a "backward" flag; and
   marking any gate that is marked with both a "forward" flag and a "backward" flag as belonging to the given one of the one or more logic modules.

3. The method of claim 1, wherein the assigning comprises:
   assigning dust logic to the one or more logic modules.

4. The method of claim 3, wherein the assigning the dust logic comprises:
   identifying, for each dust logic gate, a collection of neighbor gates including an input neighbor gate and an output neighbor gate;
   assigning the each dust logic gate to one of the one or more logic modules that is most represented by the collection of neighbor gates.

5. The method of claim 4, wherein the identifying and the assigning are performed for one dust logic gate at a time, and all dust logic gates are sorted in ascending order according to a number of neighbor gates that are not assigned to one of the one or more logic modules.

6. The method of claim 1, wherein the placing comprises:
   representing each logic module of the integrated circuit as a set of one or more circular objects; and
   positioning each set of one or more circular objects within boundaries of a floorplan corresponding to the integrated circuit.

7. The method of claim 6, wherein the positioning keeps each set of the one or more circular objects intact.

8. The method of claim 6, wherein the positioning honors a movebound constraint that requires that a given logic module be placed within a given area of the floorplan.

9. The method of claim 8, wherein the movebound constraint is defined by the soft hierarchy.

10. The method of claim 6, wherein the positioning honors an attraction that pulls two cells of the integrated circuit together.

11. The method of claim 6, wherein the positioning honors an attraction that pulls a cell of the integrated circuit toward a fixed point.

12. The method of claim 11, wherein the fixed point is at least one corner of a rectangular region of the floorplan.

13. The method of claim 11, wherein the cell of the integrated circuit is a boundary cell, and the fixed point is a center of a movebound.

14. A computer readable storage device containing an executable program for physically synthesizing a design of an integrated circuit, where the program performs steps of:
   compiling a logical description of the design into a flattened netlist;
   extracting a soft hierarchy from the flattened netlist, wherein the soft hierarchy defines a boundary on a die across which cells of the integrated circuit are permitted to move, wherein the extracting comprises:
      assigning gates in the flattened netlist to one or more logic modules, wherein the assigning comprises:
         marking those of the gates that carry hierarchical information with an identifier that indicates one of the one or more logic modules corresponding to the hierarchical information; and
         grouping those of the gates that are marked with a common identifier into a common one of the one or more logic modules; and
   placing a cell of the integrated circuit on the die in accordance with the soft hierarchy.

15. The computer readable storage device of claim 14, wherein the assigning further comprises, for a given one of the one or more logic modules:

tracing forward along a fanout net of each gate in the given one of the one or more logic modules, while marking the each gate with a "forward" flag;

tracing backward along a fanin net of the each gate, while marking the each gate with a "backward" flag; and marking any gate that is marked with both a "forward" flag and a "backward" flag as belonging to the given one of the one or more logic modules.

16. The computer readable storage device of claim 14, wherein the assigning comprises:

assigning dust logic to the one or more logic modules.

17. The computer readable storage device of claim 16, wherein the assigning the dust logic comprises:

identifying, for each dust logic gate, a collection of neighbor gates including an input neighbor gate and an output neighbor gate;

assigning the each dust logic gate to one of the one or more logic modules that is most represented by the collection of neighbor gates.

18. The computer readable storage device of claim 17, wherein the identifying and the assigning are performed for one dust logic gate at a time, and all dust logic gates are sorted in ascending order according to a number of neighbor gates that are not assigned to one of the one or more logic modules.

19. The computer readable storage device of claim 14, wherein the placing comprises:

representing each logic module of the integrated circuit as a set of one or more circular objects; and positioning each set of one or more circular objects within boundaries of a floorplan corresponding to the integrated circuit.

20. The computer readable storage device of claim 19, wherein the positioning keeps each set of the one or more circular objects intact.

21. The computer readable storage device of claim 19, wherein the positioning honors a movebound constraint that requires that a given logic module be placed within a given area of the floorplan.

22. The computer readable storage device of claim 21, wherein the movebound constraint is defined by the soft hierarchy.

23. Apparatus for physically synthesizing a design of an integrated circuit, the apparatus comprising:

a processor configured to:

compile a logical description of the design into a flattened netlist;

extract a soft hierarchy from the flattened netlist, wherein the soft hierarchy defines a boundary on a die across which cells of the integrated circuit are permitted to move, by:

assigning gates in the flattened netlist to one or more logic modules, wherein the assigning comprises:

marking those of the gates that carry hierarchical information with an identifier that indicates one of the one or more logic modules corresponding to the hierarchical information; and grouping those of the gates that are marked with a common identifier into a common one of the one or more logic modules; and place a cell of the integrated circuit on the die in accordance with the soft hierarchy.

* * * * *